US006861497B2

(12) United States Patent
Lindsay et al.

(10) Patent No.: US 6,861,497 B2
(45) Date of Patent: Mar. 1, 2005

(54) POLYIMIDES HAVING AN UNUSUALLY LOW AND TUNABLE ELECTRICAL RESISTIVITY USEFUL FOR ELECTRICAL AND OPTICAL APPLICATIONS

(75) Inventors: Geoffrey A. Lindsay, Ridgecrest, CA (US); Richard A. Hollins, Ridgecrest, CA (US); Peter Zaras, Ridgecrest, CA (US); Andrew J. Guenthner, Ridgecrest, CA (US); Andrew P. Chafin, Ridgecrest, CA (US); Mathew C. Davis, Ridgecrest, CA (US); Stephen Fallis, Ridgecrest, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 199 days.

(21) Appl. No.: 10/282,307

(22) Filed: Oct. 28, 2002

(65) Prior Publication Data

US 2003/0105270 A1 Jun. 5, 2003

Related U.S. Application Data

(63) Continuation-in-part of application No. 09/840,682, filed on Apr. 20, 2001, now abandoned.

(51) Int. Cl.[7] ........................ C08G 69/28; C08G 73/10; B32B 27/00

(52) U.S. Cl. ........................ 528/353; 528/125; 528/126; 528/128; 528/170; 528/171; 528/172; 528/173; 528/174; 528/175; 528/176; 528/183; 528/188; 528/220; 528/229; 528/350; 528/351; 428/411.1; 428/473.5

(58) Field of Search ................................ 528/125–126, 528/128, 170–176, 179, 183, 220, 229, 350, 351, 353; 428/411.1, 164, 473.5; 257/E51.028

(56) References Cited

U.S. PATENT DOCUMENTS

| | | | | |
|---|---|---|---|---|
| 5,231,329 A | * | 7/1993 | Nishikitani et al. | 313/503 |
| 5,256,945 A | * | 10/1993 | Imai et al. | 313/504 |
| 5,502,157 A | * | 3/1996 | Chang et al. | 528/353 |
| 5,540,999 A | * | 7/1996 | Yamamoto et al. | 428/411.1 |
| 5,688,906 A | * | 11/1997 | Jen et al. | 528/353 |
| 5,776,374 A | * | 7/1998 | Newsham et al. | 252/582 |
| 6,232,428 B1 | * | 5/2001 | Deets et al. | 528/170 |

OTHER PUBLICATIONS

G.E. Jabbour, et al., Appl. Phys. Lett. 1997, v. 71 (13), p. 1762.

S. Tokito, et al., Appl. Phys. Lett 1997, v. 70 (15), p. 1929.

R.H. Jordan, et al., Appl. Phys. Lett 1997, v. 69 (14), p. 1997.

S. A. Van Slyke, et al., Appl. Phys. Lett 1996, v. 69 (15), p. 2160.

E.S. Kolb, et al, Macromolecules 1996, v. 29, p. 2359.

J. Lu, et al., Chem. Mater. 1999, v. 11, p. 2501–2507.

G. Liou et al., Journal of Polymer Science: Part A: Polymer Chemistry, V. 40, p. 2811.

* cited by examiner

*Primary Examiner*—P. Hampton Hightower
(74) *Attorney, Agent, or Firm*—Laura R. Foster; Charlene A Haley

(57) ABSTRACT

A polyimide is disclosed of the formula:

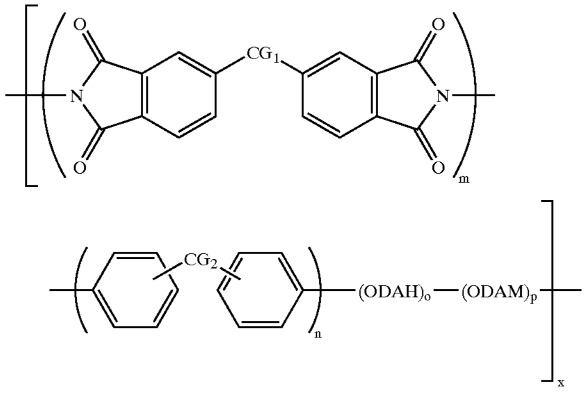

CG1 and CG2 are independently electron-accepting and/or electron-donating groups; x is an integer from about 3 to about 3000; ODAH is any of a number of known dianhydride residues; ODAM is any of a number of known diamine residues; and m, n, o, and p cumulatively add to 1.0, with the sum of m and n ranging from about 0.05 to about 1.0, the sum of o and p ranging from about 0 to about 0.95, the sum of m and o being about 0.5 and the sum of n and p being about 0.5. In addition, a film structure comprising the polyimide and devices utilizing the film structure are disclosed.

24 Claims, No Drawings

POLYIMIDES HAVING AN UNUSUALLY LOW AND TUNABLE ELECTRICAL RESISTIVITY USEFUL FOR ELECTRICAL AND OPTICAL APPLICATIONS

This application is a continuation-in-part of U.S. patent application Ser. No. 09/840,682, filed Apr. 20, 2001 now abandoned.

STATEMENT REGARDING FEDERALLY SPONSORED RESEARCH OR DEVELOPMENT

The invention described herein may be manufactured and used by or for the government of the United States of America for governmental purposes without the payment of any royalties thereon or therefore.

BACKGROUND

1. Field of the Invention

The present invention relates to flexible polyimide materials used in thin film form that have an unusually low and tunable electrical resistivity that are useful in electrical and optical applications.

More particularly, the invention relates to flexible thin films made from polyimide materials having an adjustable number of electron-transport and/or hole-transport groups useful for tuning the electrical properties of the films, these polymers and films being useful in electrical and optical applications.

2. Description of the Related Art

Several organic compounds in thin film form having electron-transport or hole-transport properties are known. However, these organic compounds are generally limited to small molecules, for example less than 1000 Daltons in molecular weight, such as oligo phenylenes, oligo thiophenes, oligo aryl amines, and the like which form brittle films. Other common organic transport materials include small molecules that are made into films by an evaporative sublimation process, such as electron-transport materials incorporating tris(8-hydroxy)-quinoline (Alq3), or hole-transport materials incorporating triphenyldiamine derivative (TPD) (see G. E. Jabbour, et al, Elec. Lett 1997, v. 33 (24), p. 2070). Films of Alq3 and TPD must be laid down by an evaporation technique requiring expensive equipment and the film quality is difficult to reproduce (see G. E. Jabbour, et al., Appl. Phys. Lett. 1997, v. 71 (13), p. 1762; S. Tokito, et al., Appl. Phys. Lett 1997, v. 70 (15), p. 1929; R. H. Jordan, et al., Appl. Phys. Lett 1997, v. 69 (14), p. 1997; and S. A. Van Slyke, et al., Appl. Phys. Lett 1996, v. 69 (15), p. 2160). Furthermore, these small molecules tend to form crystals upon aging that change the performance characteristics of the device.

Suitable materials for flexible thin films should provide a substantially amorphous polymeric material with unusually high (and tunable) level of conductivity of electrons and/or holes, and these films additionally provide thermal stability and such characteristics as a "tunable" index of refraction, polarity, adhesion to substrates, crosslinkability for resistance to solvents, in addition to being easily processed into thin films.

Many organic materials have some, but not a sufficient number of these characteristics. One popular hole-transport material is poly(vinylcarbazole) (PVK). PVK is easily attacked by solvents used in fabricating other layers that must be placed on top of the PVK layer. Similar polymers are known to have little resistance to heat and solvent attack (e.g., E. S. Kolb, et al, Macromolecules 1996, v. 29, p. 2359). An example of a typical electron-transport polymer is poly(phenyl quinoxaline) (PPQ). PPQ suffers from solvent attack and adhesion problems. Other polymers exist which contain both hole transport and electron transport groups with high thermal stability (see J. Lu, et al., Chem. Mater. 1999, v. 11, p. 2501-2507) but their electrical resistivity properties are not known and in addition these polymers are not crosslinked, therefore they do not have the high resistance to solvents required. It is noted that tryphenylamine containing polymers are reputed to be hole transporting layer materials (see G. Liou et al., Journal of Polymer Science: Part A: Polymer Chemistry, V. 40, p. 2811) and that they may be applied in organic electroluminescent elements but no actual examples or measurements were made.

Hole transport compounds based on aromatic amine structures are described in U.S. Pat. No. 5,256,945 issued to Imai et al. on Oct. 26, 1993 but these structures are oligomeric, not polyimides and do not have the properties required for the present invention.

Structures of polymeric thin films and the process for forming the film have been disclosed in U.S. Pat. No. 5,231,329 issued to Nishikitani et al. on Jul. 27, 1993 and U.S. Pat. No. 5,540,999 issued to Yamamoto et al. on Jul. 30, 1996, incorporated herein by reference. These patents neither disclose the polyimide polymer structure of the present invention, nor do these patents disclose the advantages of the presently described structure, such as low electrical resistivity and solvent resistance.

In U.S. Pat. No. 6,232,428 issued to Deets et al. on May 15, 2001 a process is described that creates colorless and transparent polyimide coatings or films. This process does not tune polyimides for electrical conductivity or resistivity by the incorporation of specific electron transport and hole transport groups. The films created in Deets do not have the properties required of the present invention.

In U.S. Pat. No. 5,502,157 issued to Chang et al. on Mar. 26, 1996 a copolyimide is disclosed that will be an electrical insulator and contains no monomer units that would reduce electrical resistivity.

There is a need for materials that provide unusually high conductivity (and conversely, unusually low electrical resistivity) of electrons and/or holes in amorphous thin-film form that are optically transparent. The required range of electrical resistivity of the materials is from $10^6$ to $10^{16}$ Ohm-centimeters. Additionally, it is preferable that these materials provide thermal stability with such characteristics as a "tunable" index of refraction, polarity, adhesion to substrates, crosslinkability for resistance to solvents, and that are also easily processed into thin films. The present invention addresses these needs.

SUMMARY OF THE INVENTION

An object of a preferred embodiment of the present invention is to provide a polyimide of the formula:

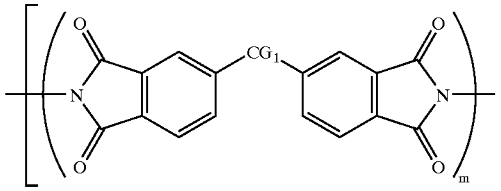

-continued

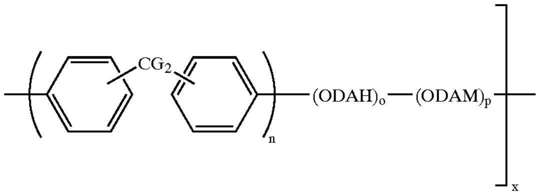

CG1 and CG2 are independently electron-accepting and/or electron-donating groups; x is an integer from about 3 to about 3000; ODAH is any of a number of known dianhydride residues; ODAM is any of a number of known diamine residues; and m, n, o, and p cumulatively add to 1.0, with the sum of m and n ranging from about 0.05 to about 1.0, the sum of o and p ranging from about 0 to about 0.95, the sum of m and o being about 0.5 and the sum of n and p being about 0.5.

An object of a preferred embodiment of the present invention is to provide a flexible thin film having a tunable electrical resistivity and tunable dielectric constant including a polyimide of the formula:

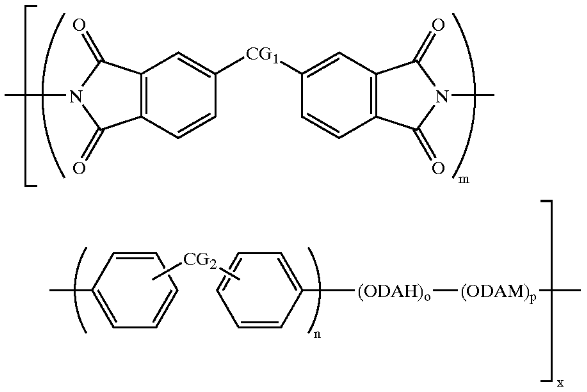

CG1 and CG2 are independently electron-accepting and/or electron-donating groups; x is an integer from about 3 to about 3000; ODAH is any of a number of known dianhydride residues; ODAM is any of a number of known diamine residues; and m, n, o, and p cumulatively add to 1.0, with the sum of m and n ranging from about 0.05 to about 1.0, the sum of o and p ranging from about 0 to about 0.95, the sum of m and o being about 0.5 and the sum of n and p being about 0.5.

Additionally, another embodiment of the present invention includes a device utilizing a flexible thin film having at least one layer of a polyimide of the formula:

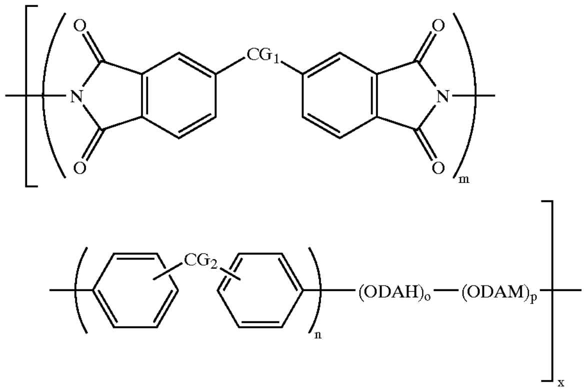

CG1 and CG2 are independently electron-accepting and/or electron-donating groups; x is an integer from about 3 to about 3000; ODAH is any of a number of known dianhydride residues; ODAM is any of a number of known diamine residues; and m, n, o, and p cumulatively add to 1.0, with the sum of m and n ranging from about 0.05 to about 1.0, the sum of o and p ranging from about 0 to about 0.95, the sum of m and o being about 0.5 and the sum of n and p being about 0.5.

Advantages of embodiments of the present invention include:

a material with unusually high and tunable conductivity of electrons and/or holes (as measured by the electrical resistivity; this conductivity will also increase the dielectric constant of the film);

a material that is easily processed into amorphous thin-film form;

a flexible thin film with mechanical and thermal stability;

a material with a "tunable" index of refraction and polarity;

a material with good adhesion to substrates;

a material with good optical transparency;

a material with crosslinkability for resistance to solvents.

DETAILED DESCRIPTION OF THE INVENTION

An object of a preferred embodiment of the present invention is to provide a polyimide of the formula:

(I)

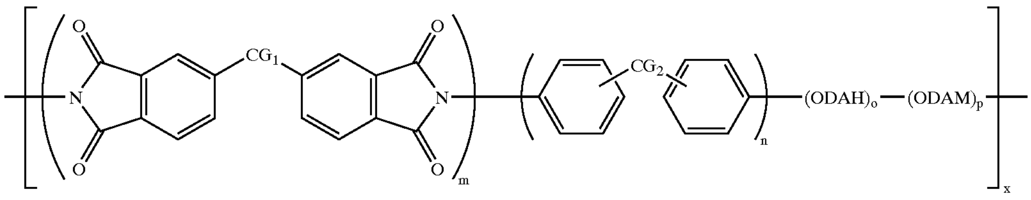

CG1 and CG2 are independently electron-accepting and/or electron-donating groups; x is an integer from about 3 to about 3000; ODAH is any of a number of known dianhydride residues; ODAM is any of a number of known diamine residues; and m, n, o, and p cumulatively add to 1.0, with the sum of m and n ranging from about 0.05 to about 1.0, the sum of o and p ranging from about 0 to about 0.95, the sum of m and o being about 0.5 and the sum of n and p being about 0.5.

A preferred embodiment of the present invention includes a flexible thin film, generally an electron-transfer and/or hole-transfer film, including a polyimide of the formula:

(I)

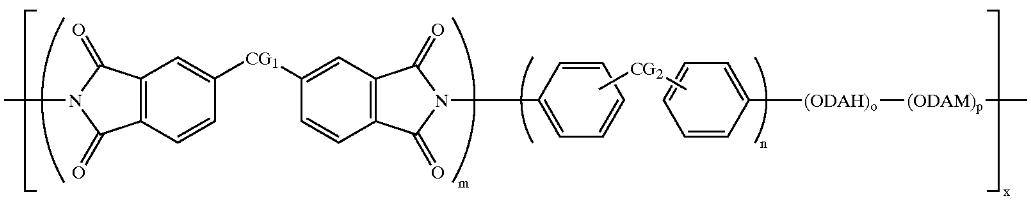

CG1 and CG2 are independently electron-accepting and/or electron-donating groups; x is an integer from about 3 to about 3000; ODAH is any of a number of known dianhydride residues; ODAM is any of a number of known diamine residues; and m, n, o, and p cumulatively add to 1.0, with the sum of m and n ranging from about 0.05 to about 1.0, the sum of o and p ranging from about 0 to about 0.95, the sum of m and o being about 0.5 and the sum of n and p being about 0.5.

In another embodiment of the present invention the polyimide includes more than one type of CG1-containing dianhydride residues represented by

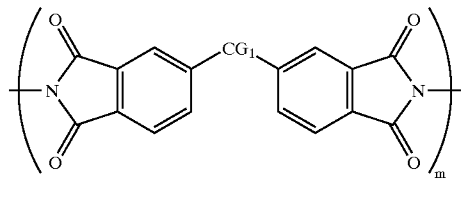

and/or more than one type of CG2-containing diamine residues represented by

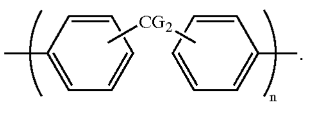

The present invention provides a substantially amorphous polymeric material that has unusually high conductivity of electrons, unusually high conductivity of holes, or both electron-transport and hole-transport combination. The conductivity of electrons and holes results in the film having a range of electrical resistivity from $10^6$ to $10^{16}$ Ohm-centimeters. The flexible films of the present invention are easily processed into thin films that are thermally stable, as well as having crosslinkability for resistance to solvents, a "tunable" index of refraction, and adhesion to substrates such that they do not delaminate upon cutting a multilayer film into dies.

It has been demonstrated that polymer films can be chemically doped to lower the electrical resistivity by many orders of magnitude. Chemical doping techniques are known to those skilled in the art of electrically conductive polymers, particularly those having a conjugated backbone structure, such as polypyrroles, polythiophenes, and polyanilines. The doping is typically done with an acid, oxidant, base, or reductant. These polymer films lack the balance of properties required for optical applications. The films of the present invention can be chemically "doped"; however, it is advantageous to lower the electrical resistivity of polymers (and polymer films) without resorting to chemically doping, because the chemical dopants can cause problems in the film such as moisture pick-up, electrical drift when the film is exposed to an applied electric field, and light scattering or light absorption when the film is used as an optical waveguide or an optical cladding. The hole-transport and electron-transport monomers (CG1- and CG2-containing monomers) that are part of the present invention lower the electrical resistivity without the need for chemical doping. Some diamino monomers of the present invention are already known in the literature and are shown in structures IIA and IIIA (below). Two new diamino monomers were prepared (claimed in a co-pending continuation-in-part application); they were incorporated in polyimides, and the undoped films made from these polyimides had surprisingly low electrical-resistivity. For example, a polyimide containing 50 mole % of monomer IIIB had an electrical resistivity of only $10^{10}$ ohm-cm.

Additionally, it is preferable that the film have thermal stability such that its electrical properties do not change after aging at 200° C. for an hour, have an index of refraction tunable in the range of 1.5 to 1.8, have good adhesion to substrates, have crosslinkability for resistance to solvents, and are optically transparent.

In a more preferred embodiment, the polyimide materials, shown in formula (I) above, are comprised of electron-accepting groups, and exhibit electron-transport (ET) properties. The formula (I) in such polyimide structures has electron-accepting groups represented by at least one of CG1 and CG2, preferably CG2. CG2 preferably is an electron-accepting structure, such as:

(IIA)

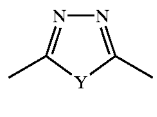

or the structure of:

(IIB)

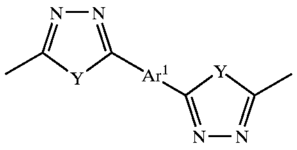

or the structure of:

(IIC)

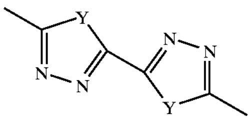

or the structure of:

(IID)

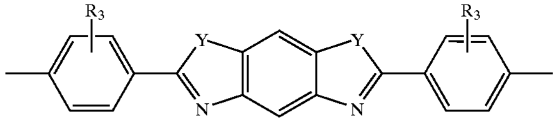

or the structure of:

(IIE)

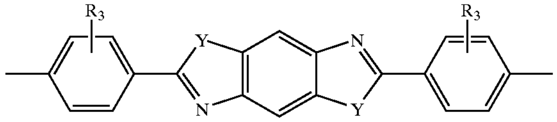

in which Y is an oxygen (O), a sulfur (S), or an amino (N-$Ar^1$), $Ar^1$ is a phenyl, biphenyl, naphthyl, or other similar aromatic group or fluorinated aromatic group, and $R_3$ is methyl, trifluoromethyl, hydroxyl, or hydrogen.

Another embodiment the polyimide material, shown in formula (I) above, includes electron donating groups, and exhibits hole-transport (HT) properties. The formula in such polyimide structures has electron-donating groups represented by at least one of CG1 and CG2, preferably CG2, which preferably has a strong electron-donating structure such as:

(IIIA)

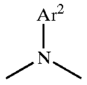

or the structure of:

(IIIB)

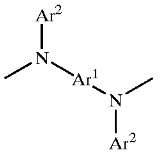

in which $Ar^1$ is a phenyl, biphenyl, naphthyl, or other similar aromatic group, and $Ar^2$ is a phenyl, biphenyl, naphthyl, or other similar aromatic group, and $Ar^2$ may have electron-donating substituents, such as methyl or other alkyl.

Other embodiments of the present invention include: (1) more than one type of CG1-containing dianhydride residues and CG2-containing diamine residues in the same polymer; (2) the above-described formula (I) having a hole-transport group and an electron-transport group in the same polymer; preferably represented by two CG2-containing diamine residues.

ODAH and ODAM of formula (I) are neither strong electron-donating nor strong electron-accepting groups, and are repeat units in the polyimide backbone derived from any one of a number of known dianhydrides and diamine monomers used to form polyimides. These groups may be added to enhance or fine-tune and adjust certain other properties of the film, such as refractive index and glass transition temperature. The fine-tuning of the film by selection of these units may be experimentally defined and determined by one of ordinary skill in the art. Representative examples of ODAH units that are known in the art non-exclusively include co-monomer structures such as:

(IVA)

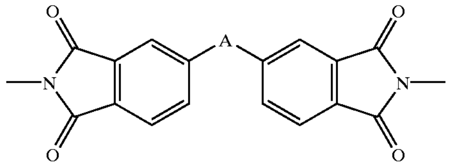

and, representative examples of ODAM units that are known in the art non-exclusively include co-monomer structures such as (IVB)

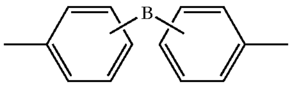

in which A and B non-exclusively represent such groups as —O—, —S—, —$S(O)_2$—, —C(O)—, —C(O)—O—$(CH_2)_n$—O—C(O)—, —$C(CF_3)_2$—, —$C(CH_3)_2$—, —C(Ar)($CF_3$)—, —P(O)(Ar)—, and —O—$(CH_2)_n$—O—, where n is an integer that may range from about 1 to about 12, and Ar represents an aryl group. Representative examples of ODAH also include dianhydride derivatives such as:

(IVC)

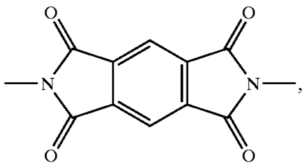

, and (IVD)

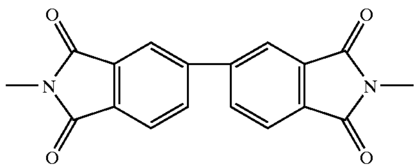

and other like dianhydride derivatives; and representative examples of ODAM also include diamine derivatives such as:

(IVE)

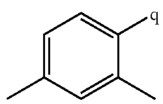

and, (IVF)

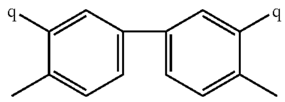

and other like diamines, where q may be OH or SH. Co-monomer structures, such as that shown in formulas IVE and IVF, are desirable in crosslinking applications of the present invention. As is known in the literature, to crosslink the polyimide having structure IVE and IVF, a commercially available di- or tri-epoxy compound may be added which react with q when the film is baked at about 180° C. or higher for an hour or more.

The total amount of co-monomer imparting either ET or HT properties in the film may be varied as a percentage of the bulk or total polymer material in order to fine-tune or adjust the electrical resistance of the film. For example, the total number of monomer units containing CG1 and CG2 groups may range from about 5 mole percent to about 100 mole percent, about 20 mole percent to about 60 mole percent, about 40 mole percent to about 50 mole percent, etc., with the optimal percentage of co-monomer imparting either ET or HT properties in the film depending on the electrical resistivity required for a particular application as determined by one skilled in the art. In situations where a higher electrical conductivity is desired for a given application, a higher percentage of ET or HT groups is used. Various amounts of the additional ODAH and ODAM monomer units may be added for imparting certain characteristics, such as increasing the solubility of the polymer, increasing adhesion to a substrate and crosslinking the film for solvent resistance, tuning the index of refraction and/or glass transition temperature, and/or lowering the dielectric constant, and/or lowering the electrical resistivity. In general, increasing the amount of fluorinated units, such as $—C(CF_3)_2—$ and $—C(Ar)(CF_3)—$, will decrease the index of refraction and decrease the dielectric constant, and increasing the amount of flexible units, such as $—C(O)—O—(CH_2)_n—O—C(O)—$ and $—O—(CH_2)_n—O—$, will decrease the glass transition temperature, $T_g$.

The polyimide formula (I) of the present invention has a range molecular weight, indicated by x, sufficient to impart strength and flexibility to the film, with the range of x determinable by those skilled in the art for a given application. For example, monofunctional amine (such as aniline) or monofunctional anhydride (such as phthalic anhydride) may be added to the polymerization reactor to cap the polyimide backbone; the molecular weight of said polyimide decreases as the ratio of monofunctional to difunctional monomer units increases. Generally for most applications x ranges preferably from about 3 to about 3000, more preferably from about 3 to about 700, and most preferably from about 10 to about 500. With x in excess of 3000, viscosity of the polyimide of the present invention in a solvent is unacceptably high.

The present invention further comprises a device including a thin film having at least one layer of polyimide of the formula:

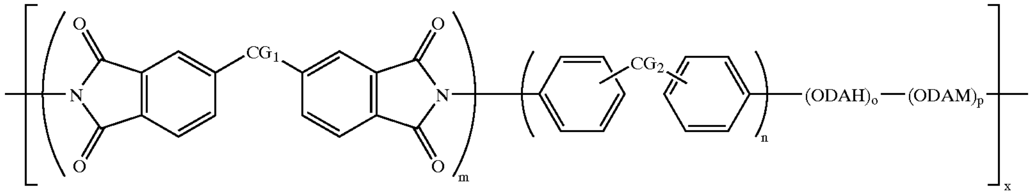

(I)

CG1 and CG2 are independently electron-accepting and/or electron-donating groups; x ranges from about 3 to about 3000; ODAH is one of a number of known dianhydride residues; ODAM is one of a number of known diamine residues; and m, n, o, and p cumulatively add to 1.0, with the sum of m and n ranging from about 0.05 to about 1.0, the sum of o and p ranging from about 0 to about 0.95, the sum of m and o being about 0.5 and the sum of n and p being about 0.5 as described above.

For example, devices which may include the thin film are various electro-optic switches, electro-optic modulators (which contain optical cladding film layers), display devices (which contain light emitting or electroluminescent film layers), electrophotographic, photo-refractive and other such devices.

Depending on the use of the device, the film may comprise only ET groups at the CG1 and/or CG2 positions, only HT groups at the CG1 and/or CG2 positions, or a combination of ET and HT groups at the CG1 and/or CG2 positions. In the ET polymer compositions, mobility of the electrons is high and mobility of holes is lower. In HT polymer compositions, the mobility of holes is high, and the mobility of electrons is lower. The work function (as defined in *Handbook of Chemistry and Physics*, 61st Edition, page F133, CRC Press) of the polyimide film will vary as the level of ET and HT groups in the film vary. Therefore, by changing the level of ET and HT groups in the polyimide, the work function of the polyimide can be changed to more closely match the work function of the device electrode to optimize the performance device for particular metal electrodes.

Applications for having both ET and HT groups in the same polyimide film may include those when rectification is not required or when electrons and holes are required to more rapidly recombine leading to greater efficiency of light-emission. The determination of using only ET groups or HT groups, or a combination of ET and HT groups for a given application is determinable by those of ordinary skill in the art.

Single or multiple layers of the ET layer, HT layer, and/or combination ET and HT layer may be formed.

For applications in electrophotographic processes, the thickness of layers may range of from about 0.1 to about 15 mm dry thickness. For other applications, such as electroluminescent devices, the layer thickness typically ranges from about 50 angstroms to about 10,000 angstroms, more preferably in the range of from about 500 angstroms to about 1500 angstroms, with the optimal layer thickness for a given application determinable by those skilled in the art. For applications in electro-optic modulators, the low electrical resistivity layer (the cladding layer) thickness typically ranges from about 0.5 to about 5 microns, and more preferably from about 1 to about 4 microns.

The following examples illustrate the preparation of the compound and manufacture of thin films of the present invention.

Preparation of the Poly(amic Acid) and Polyimide Compositions

Films can be prepared from solutions of the poly(amic acid) or from solutions of the polyimide. Once the film is formed, the poly(amic acid) is converted to the polyimide by heating. The poly(amic acid) and polyimide compositions of the present invention are prepared by normal polymerization procedures known to those skilled in the art. For example, diamines and dianhydrides are stirred in a dry solvent for several hours at room temperature to form a resultant poly(amic acid). During the polyimerization small amounts, of monofunctional anhydrides, such as phthalic anhydride, or amines, such as aniline, may be used approximately 1 to 5% of the total monomers charged, to lower the molecular weight of the polyimide. When the polymerization is completed, the reaction mixture can be precipitated in alcohol and isolated by filtration. To make the polyimide, the temperature of the solution of poly(amic acid) is increased to about 1 80° C. for several hours to complete the imidization reaction. The reaction solution is then poured into an excess of alcohol to precipitate the polymer. Solvent is removed by filtration. The dissolution and precipitation process may be repeated several times to further purify the polymer. The resulting solid is dried in a heated vacuum oven.

Preparation of the Thin Film

Solvents that can be used to dissolve the polyimide or poly(amic acid), non-exclusively, include N-methyl pyrrolidinone (NMP), dimethylformamide (DMF), diglyme, ethyl lactate, tetrahydrofuran, chloroform, and other chlorinated solvents. These solvents are useful in casting films, for example, ranging in thickness from 20 nanometers to 20 millimeters. The polyimide materials, as described above, are normally cast into films by dissolving the polyimide in a solvent, such as N-methyl pyrrolidinone (NMP), typically making up a solution of 12 to 25 weight percent total solids, and casting a film of this solution on a solid substrate, such as a glass slide or silicon wafer. The film is baked near or above the glass transition temperature of the polyimide to remove the solvent. The amic acid form of the polymer may also be used to cast a film from solution. The imidization is then accomplished in the solid state by heating the film to drive off the water of imidization, typically above 180° C. The films may be crosslinked by employing a polyimide containing a hydroxy phenyl unit in the backbone (such as structure IVE above), and mixing a small amount of crosslinking agent in solution with the polyimide. Crosslinking agents such as commercial diepoxy compounds or dioxazalone compounds may be used. Crosslinked films are cured from about 180° C.–240° C., or above the glass transition temperature, whichever is higher, for approximately one hour in order to bring about the crosslinked reaction.

Methods for making the film include methods commonly known in the art, such as casting and spin-coating, with the appropriated method for a given application determinable by those skilled in the art.

Electrical Resistivity Measurements

Samples for use in the resistivity apparatus were prepared by casting the polymer film on a gold-coated glass substrate. The other side of the glass had a conductive indium-tin-oxide coating electrically connected to the gold with a gold strip coming around the side. A gold electrode was then sputtered on top of the polymer film making a sandwich with the polymer film in between gold electrodes. The sample was placed on a copper ground plane electrode in the resistivity apparatus. The contact to the top gold electrode of the sample was made through a gold spring and a tension mechanism. A vacuum of about 100 millitorr is applied to the sample. A direct current (dc) voltage was applied to the top gold electrode. Current versus voltage readings are taken over the range of 1 to 15 volts (typically in 10 steps, one minute at each step) on a film of about 2 microns in thickness. The current flowing through the polymer film was measured with a Keithly model 642 vibrating reed electrometer. The low limit of current this electrometer can measure is $8\times10^{-16}$ amperes. The current is then plotted versus the voltage to determine the resistance (R), which is equal to the slope of the plot. The resistivity, r, of the polymer film is proportional to the resistance according to the following relation: $r=(R*A/L)$, where A is the area of the top electrode and L is the thickness of the film.

EXAMPLE 1

Synthesis of an Electron-Transporting Poly(amic Acid), Sample PZ1611-89:

A 20 mL round-bottom flask was charged with 10 mL N-methyl pyrrolidinone (NMP) solvent. To this solvent was added 0.5 g biphenyl 3,3',4,4'-tetracarboxylic dianhydride (s-BPDA purchased from ChrisKev Co., Inc.). The contents were heated to 90° C. in an oil bath to dissolve the s-BPDA monomer. The contents were cooled to room temperature and 0.58 g 2,5-bis(4-aminophenyl)-1,3,4-oxadiazole (purchased from Aldrich, Inc.) was added (this is the electron-transport monomer). The contents were stirred overnight under a positive nitrogen blanket. The homogenous poly(amic acid) solution was poured into 200 mL methanol and a white precipitate formed. The resulting polymer was filtered and dried under vacuum.

EXAMPLE 2

Synthesis of Another Electron-Transporting Poly(amic Acid), Sample PZ1564-72:

A 25 mL round-bottom flask was charged with 5 mL N-methyl pyrrolidinone (NMP) solvent. To this solvent was added 0.6 g ethylene glycol bis(anhydro-trimellitate) (TMEG-100 purchased from ChrisKev Co., Inc.) and 0.37 g 2,5-bis(4-aminophenyl)-1,3,4-oxadiazole (purchased from Aldrich, Inc.). The contents were stirred 12 hours at room temperature under a positive nitrogen blanket. The homogenous solution was poured dropwise into 50 mL methanol. The resulting poly(amic acid) was washed with absolute ethanol, filtered and dried for one day under 0.05 torr vacuum at room temperature (0.95 g recovered).

EXAMPLE 3

Synthesis of a Hole-Transporting Poly(amic Acid), Sample PZ1564-74:

0.465 g (1.135 mmol) of ethylene glycol bis(anhydro-trimellitate (TMEG-100 purchased from ChriKev Company, Inc.) and 0.5 g (1.135 mmol) N,N'-bis(4-aminophenyl)-N, N'-diphenyl-1,4phenylenediamine (sample RAH 1556-4, this is the hole-transport monomer) were dissolved in 5 mL of dry N-methylpyrrolidinone solvent. This mixture was stirred under a nitrogen atmosphere at room temperature for 2 hours. The poly(amic acid) solution was then poured into a large excess of absolute ethanol and the solid precipitate was isolated by filtration. After drying in vacuum (0.05 torr) at 25 C for several hours, 1.4 g of material was obtained.

EXAMPLE 4

Synthesis of a Hole-Transporting Diamino Monomer (Sample RH1556-46) Used for Making the Polyimide in Example 3:

A mixture of 2.60 g of N,N'-p-phenylenediamine, 2.9 g p-fluoronitrobenzene and 3.0 g of cesium fluoride in 25 ml of dry DMSOP was heated briefly to 160° C. and then maintained at 130° C. overnight. The mixture was cooled then poured into water and the dark red solid filtered off and air dried (850 mg). NMR indicated the solid to be the mono adduct. The mono adduct was redissolved in a mixture of 1 g of p-fluoronitrobenzene and 1 g of cesium fluoride in 10 ml of dry DMSO and the mixture heated at 130° C. under nitrogen for 72 hr. The cooled reaction mixture was added to water and the red solid filtered off. The solid was boiled with absolute ethanol and then washed with more hot ethanol and dried to the desired dinitrocompound (sample RH1531-51E).

One gram of the dinitro compound from above (sample RH1531-51E) was dissolved in 50 mL tetrahydrofuran (THF) and 50 mL of ethanol and 150 mg of $PtO_2$ added. This solution was bubbled with 1 atmosphere of hydrogen gas. After 35 minutes, the solution turned from a red color to a pale brown color. The mixture was filtered through celite to remove the catalyst, then most of the THF solvent was evaporated. A little more ethanol was added; the solution heated to boil; then cooled in a refrigerator overnight. Crystals precipitated from solution and were removed by filtration. After drying in a vacuum oven 0.627 grams of product was recovered (71% yield). The melting point was 251–253 C. The proton NMR spectrum indicated this material was very pure.

EXAMPLE 4b

Synthesis of an Electron-Transporting Diamino Monomer (Sample AC33-17-21-13) Used for Making Polyimides with Low Electrical Resistivity:

A solution of 10.00 g oxalyl dihydrazide (55 mmoles) in 200 mL dimethyl acetamide was cooled to <0 C (ice/salt bath) while 21.60 g 4-nitrobenzoyl chloride was added in portions. The mix was stirred overnight at RT then poured over a mix of ice/IN HCl. The solids were filtered off and washed with $H_2O$ to give 22.40 g (98%) of the 4,4'-bis (nitrophenyl)-dihydrazid). $^1H$ NMR (DMSO-$d_6$): 8.14 (d, 4H), 8.35 (d, 4H), 10.90 (NH), 11.02 (NH). A mixture of 22.4 g (53.8 mmoles) of the 4,4'-bis(dinitrophenyl)-dihydrazid and 200 mL $POCl_3$ were refluxed for 18 hrs then cooled and poured over ice. The solids were filtered off and washed with $H_2O$ then dried and recrystallized from 500 mL DMSO to give 17.33 g (85%) of 5,5'-di(4-nitrophenyl)-2,2'-bis-oxadiazole. $^1H$ NMR (DMSO-$d_6$, 90 C): 8.42 (d, 4H), 8.48 (d, 4H). $^{13}$ C NMR (DMSO-$d_6$, 90 C): 124.1, 127.4, 128.3, 149.7, 153.1, 163.7. Mass Spec (m/z): 380 $M^+$, 150.

200 mL of phenyl hydrazine was added to 2.65 g 5,5'-di (4-nitrophenyl)-2,2'-bis-oxadiazole (6.44 mmoles) and placed in an oil bath at 180 C under $N_2$. After three days at 180 C the mixture was cooled and poured into 400 mL benzene. The solids were filtered off and washed with hot MeOH to give 5,5'-di(4-aminophenyl)-2,2'-bis-oxadiazole. $^1H$ NMR (DMSO-$d_6$, 90 C): 6.13 (s, 4H, $NH_2$), 6.72 (d, 4H), 7.77 (d, 4H).

EXAMPLE 5

Synthesis of a Conventional Polyimide that has High Electrical Resistivity (this Polyimide Contains No CG1 nor CG2 ET or HT Groups):

Sample PZ1564-65 was prepared from the following charge of monomers: 50 mol % ethylene glycol bis(anhydro-trimellitate) (called TMEG from ChrisKev Co., Inc. ), 33 mol % C5, 13 mol % C3, and 4 mol % of silanated 2,4-diaminophenol. The monomers were dissolved in NMP solvent, as described above, for 6 hours at room temperature, then at 180 C overnight. The structure of C5 and C3 are shown below and described in U.S. Pat. No. 6,389,215 (included herein as a reference to prior art):

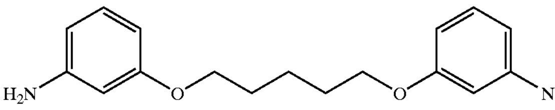

= C5 and

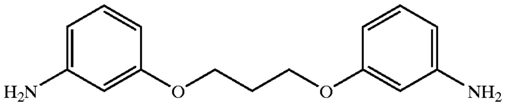

= C3

This polyimide was recovered as a tan powder after precipitation in methanol , filtering, and drying in a vacuum oven over night at 60° C.

EXAMPLE 6

This Example Describes How Films of Polyimide are Prepared from Solutions of the Poly(amic Acid):

Sample PZ1611-89 poly(amic acid) from Example 1 and PZ1564-65 from Example 2 were cast on a conductive substrate as described above from a solution of NMP (typically 12% polymer was dissolved in the NMP). The NMP solvent was removed by baking in vacuum at elevated temperature (200° C.) for several hours. The gold electrode was deposited on top of the film by using a sputter coater. Between 1000 and 2000 Angstroms of Au was applied. Ultra-high purity Argon gas atmosphere at a vacuum that produces a current of 18 milliamps was employed, pausing for 30 seconds between cycles to keep samples temperatures low. The film made from sample PZ1611-89 had an electrical resistivity of $1.7\times10^{14}$ Ohm-cm. The film made from sample PZ1564-65 had an electrical resistivity of $5\times10^{17}$ Ohm-cm. The film made from sample PZ1636-56 had an electrical resistivity of $6.75\times10^{10}$ Ohm-cm. (Sample PZ1636-56 is a hole transport polymer similar to the polymer made in Example 3, except that it contains, 5 mole % diaminophenol monomer, which provides a crosslinking site.)

It should be understood that the foregoing summary, detailed description, and examples of the invention are not intended to be limiting, but are only exemplary of the inventive features that are defined in the claims.

What is claimed is:

1. A polyimide of the formula:

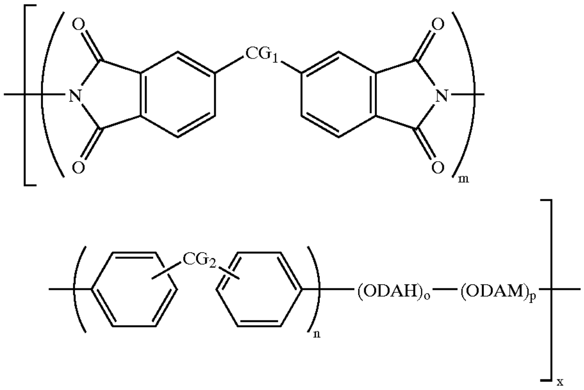

wherein CG1 and CG2 are independently selected from the group consisting of an electron-accepting group and a electron-donating group, and x is an integer from about 3 to about 3000;

ODAH is any known dianhydride residue and ODAM is any known diamine residue, and ODAH and ODAM are selected to fine-tune properties of said polyimide;

wherein m, n, o, and p cumulatively add to 1.0;

the sum of m and n is about 0.05 to about 1.0, the sum of o and p is about 0 to about 0.95, the sum of m and o is about 0.5 and the sum of n and p is about 0.5; and said polyimide having an electrical resistivity within the range of from $10^6$ to $10^{16}$ Ohm-centimeters, said polyimide's electrical resistivity being adjustable within said range of from $10^6$ to $10^{16}$ Ohm-centimeters.

2. The polyimide of claim 1 wherein the total number of said CG1 and CG2 groups range from about 5 mole percent to about 100 mole percent, whereby the optimal percentage is selected in order to fine tune the electrical resistivity required for a particular application between $10^6$ to $10^{16}$ Ohm-centimeters.

3. The polyimide of claim 1 wherein more than one CG1 group and/or more than one CG2 group are selected.

4. The polyimide of claim 1 wherein more than one ODAH group and/or more than one ODAM group are selected.

5. The polyimide of claim 1 wherein CG1 and CG2 are electron-accepting groups.

6. The polimide of claim 1 wherein more than one CG1 group and/or more than one CG2 group are selected from at least one electron-donating group and at least one electron-accepting group.

7. The polyimide of claim 1 wherein CG2 has an electron accepting structure comprising:

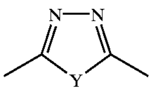

wherein Y is selected from the group consisting of oxygen (O), sulfur (S), and an amino (N—$Ar^1$), wherein $Ar^1$ is an aromatic hydrocarbon.

8. The polyimide of claim 1 wherein CG2 has an electron accepting structure comprising:

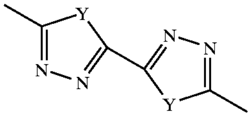

wherein Y is selected from the group consisting of oxygen (O), sulfur (S), and an amino (N—$Ar^1$), wherein $Ar^1$ is an aromatic hydrocarbon.

9. The polyimide of claim 1 wherein CG2 has an electron accepting structure comprising:

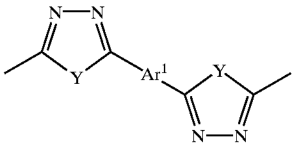

wherein Y is selected from the group consisting of oxygen (O), sulfur (S), and an amino (N—$Ar^1$), wherein $Ar^1$ is an aromatic hydrocarbon.

10. The polyimide of claim 1 wherein CG1 and CG2 are electron-donating groups.

11. The polyimide of claim 1 wherein CG2 has an electron donating structure comprising:

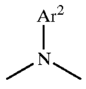

in which $Ar^2$ is an aromatic group.

12. The polyimide of claim 1 wherein CG2 has a strong electron donating structure comprising:

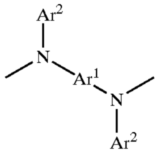

in which $Ar^1$ and $Ar^2$ are aromatic groups.

13. A flexible thin film comprising a polyimide of the formula:

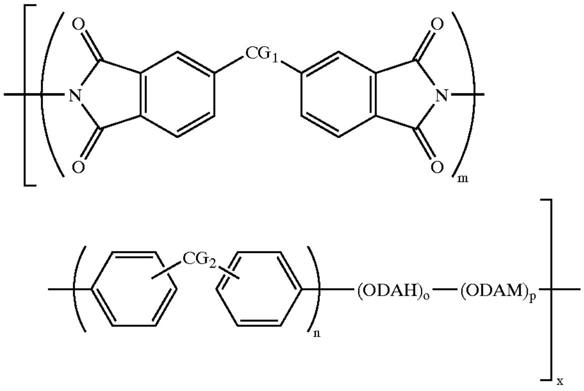

wherein CG1 and CG2 are independently selected from the group consisting of an electron-accepting group and a electron-donating group, and x is an integer from about 3 to about 3000;

ODAH is any known dianhydride residue and ODAM is any known diamine residue, and ODAH and ODAM are selected to fine-tune properties of said polyimide;

wherein m, n, o, and p cumulatively add to 1.0;

the sum of m and n is about 0.05 to about 1.0, the sum of o and p is about 0 to about 0.95, the sum of m and o is about 0.5 and the sum of n and p is about 0.5 ; and said polyimide film having an electrical resistivity within the range of from $10^6$ to $10^{16}$ Ohm-centimeters, said polyimide film's electrical resistivity being adjustable within said range of from $10^6$ to $10^{16}$ Ohm-centimeters.

14. The film of claim 13 wherein the total number of said CG1 and CG2 groups range from about 5 mole percent to about 100 mole percent, whereby the optimal percentage is selected in order to fine tune the electrical resistivity required for a particular application between $10^6$ to $10^{16}$ Ohm-centimeters.

15. The film of claim 13 wherein more than one CG1 group and/or more than one CG2 group are selected.

16. The film of claim 13 wherein more than one ODAH group and/or more than one ODAM group are selected.

17. The film of claim 13 wherein CG1 and CG2 are electron-accepting groups.

18. The film of claim 13 wherein more than one CG1 group and/or more than one CG2 group are selected from at least one electron-donating group and at least one electron-accepting group.

19. The film of claim 13 wherein CG2 has an electron accepting structure comprising:

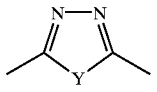

wherein Y is selected from the group consisting of oxygen (O), sulfur (S), and an amino (N—$Ar^1$), wherein $Ar^1$ is an aromatic hydrocarbon.

20. The film of claim 13 wherein CG2 has an electron accepting structure comprising:

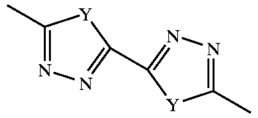

wherein Y is selected from the group consisting of oxygen (O), sulfur (S), and an amino (N—$Ar^1$), wherein $Ar^1$ is an aromatic hydrocarbon.

21. The film of claim 13 wherein CG2 has an electron accepting structure comprising:

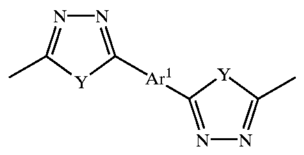

wherein Y is selected from the group consisting of oxygen (O), sulfur (S), and an amino (N—$Ar^1$), wherein $Ar^1$ is an aromatic hydrocarbon.

22. The film of claim 13 wherein CG1 and CG2 are electron-donating groups.

23. The film of claim 13 wherein CG2 has an electron donating structure comprising:

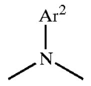

in which $Ar^2$ is an aromatic group.

24. The film of claim 13 wherein CG2 has a strong electron donating structure comprising:

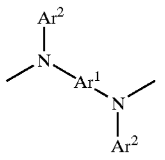

in which $Ar^1$ and $Ar^2$ are aromatic groups.

* * * * *

UNITED STATES PATENT AND TRADEMARK OFFICE

CERTIFICATE OF CORRECTION

PATENT NO. : 6,861,497 B2
DATED : March 1, 2005
INVENTOR(S) : Geoffrey A. Lindsay et al.

It is certified that error appears in the above-identified patent and that said Letters Patent is hereby corrected as shown below:

Title page,
Item [75], Inventors, change from "Peter Zaras" to -- Peter Zarras --; and change "Mathew C. Davis" to -- Matthew C. Davis --

Signed and Sealed this

Seventeenth Day of May, 2005

JON W. DUDAS
*Director of the United States Patent and Trademark Office*